US008909507B2

(12) United States Patent
Tsourapas et al.

(10) Patent No.: US 8,909,507 B2
(45) Date of Patent: Dec. 9, 2014

(54) DUTY CYCLE INDEPENDENT REAL TIME DYNAMIC PROGRAMMING IMPLEMENTATION FOR HYBRID SYSTEMS CONTROLS OPTIMIZATION

(75) Inventors: Vasilios Tsourapas, Northville, MI (US); Chinmaya B. Patil, Farmington Hills, MI (US)

(73) Assignee: Eaton Corporation, Cleveland, OH (US)

( * ) Notice: Subject to any disclaimer, the term of this patent is extended or adjusted under 35 U.S.C. 154(b) by 984 days.

(21) Appl. No.: 13/018,088

(22) Filed: Jan. 31, 2011

(65) Prior Publication Data

US 2012/0130695 A1 May 24, 2012

Related U.S. Application Data

(60) Provisional application No. 61/416,549, filed on Nov. 23, 2010.

(51) Int. Cl.
*G06F 17/50* (2006.01)
*G05B 13/04* (2006.01)
*G06F 13/10* (2006.01)
*G06F 11/26* (2006.01)

(52) U.S. Cl.
CPC ............ *G05B 13/048* (2013.01); *G06F 13/105* (2013.01); *G06F 17/50* (2013.01); *G06F 11/261* (2013.01)
USPC ................. 703/8; 703/1; 703/2; 703/6; 703/7

(58) Field of Classification Search
None
See application file for complete search history.

(56) References Cited

U.S. PATENT DOCUMENTS

| 8,108,092 | B2 * | 1/2012 | Phillips et al. | 701/23 |
| 8,396,611 | B2 * | 3/2013 | Phillips et al. | 701/2 |
| 8,428,843 | B2 * | 4/2013 | Lee et al. | 701/93 |
| 8,577,517 | B2 * | 11/2013 | Phillips et al. | 701/2 |
| 8,612,107 | B2 * | 12/2013 | Malikopoulos | 701/59 |

OTHER PUBLICATIONS

Hellstrom et al. "Look-ahead Control for Heavy Trucks to Minimize Trip Time and Fuel Consumption", Control Engineering Practice 17 (2009) 245-254.*
Hellstrom, Erik. "Look-ahead Control of Heavy Vehicles: Management of Kinetic and Electric Energy in Heavy Trucks", Apr. 2010.*
A.P. de Madrid, et al., "Reduction of the Dimensionality of Dynamic Programming: A Case Study"; American Control Conference, (Jun. 1999).

(Continued)

*Primary Examiner* — Shambhavi Patel
(74) *Attorney, Agent, or Firm* — Rader, Fishman & Grauer PLLC

(57) ABSTRACT

Predicted environment conditions are received for time steps within a prediction horizon N. Information is accessed regarding expected system responses generated by a system model, each expected system response related to a different combination of control parameters and starting environment conditions applied to the model.

An optimal response is designated for each combination of starting environment conditions for each time step from time step N−1 to the current time step based in part on the expected system response and the predicted environment conditions, each optimal response in a time step based at least in part on an optimal response determined for a later time step.

For the current time step, for starting environment conditions substantially similar to the current environment conditions, the combination of control parameters that results in the system response designated as the optimal response is determined from the expected system responses and is applied to the system.

24 Claims, 9 Drawing Sheets

(56) References Cited

OTHER PUBLICATIONS

Jun-Mo Kang, et al., "Approximate Dynamic Programming Solutions for Lean Burn Engine Aftertreatment"; IEEE 38th Conference on Decision & Control, (Dec. 1999).

Olle Sundstroem, et al, "A Genernica Dynamic Programming Matlab Function," 18th IEEE International Conference, (Jul. 8-10, 2009).

Jeffrey A. Cook, et al., "Control, Computing and Communications: Technologies for the Twenty-First Centruy Model T," Proceedings of the IEEE (Feb. 2, 2007).

S. Di Cairano, et al., "Driver-assist steering by active front steering and differential braking: design, implementation and experimental evaluation of a switched model predictive control approach." 49th IEEE Conference (Dec. 2010).

H. Ali Borhan, et al., "Nonlinear Model Predictive Control for Power-split Hybrid Electric Vehicles." (49th IEEE Conference (Dec. 2010).

T. van Keulen, et al., "Optimal Energy Management in Hybrid Electric Trucks Using Route Information." (Oil & Gas Science and Technology Rev. IFP, vol. 65 (2010).

Olle Sundstroem, et al., "Optimal Hybridization in Two Parallel Hybrid Electric Vehicles using Dynamic Programming." 17th World Congress, IFAC (2008).

Georgia-Evangelia Katsargyri, et al., "Optimally Controlling Hybrid Electric Vehicles using Path Forecasting." 2009 American Confrol Conference (Jun. 2009).

H. Ali Borhan, et al., "Predictive Energy Management of a Power-Split Hybrid Electric Vehicle." (2009 American Control Conference (Jun. 2009).

Ed. D. Tate, et al., "SP-SDP for Fuel Consumption and Tailpipe Emissions Minimization in an EVT Hybrid." General Motors & Univeristy of Michigan Manuscript, (2006).

Chan-Chiao Lin, et al., "A Stochastic Control Strategy for Hybrid Electric Vehicles." 2004 American Confrol Conference, (Jun.-Jul. 2004).

M. Bichi, et al., "Stochastic Model Predictive Control and Driver Behavior Learning for Improved Powertrain Control." 49th IEEE Conference (Dec. 2010).

Chan-Chiao Lin, et al., "Driving Pattern Recognition for Control of Hybrid Electric Trucks." Vehicle Systems Dynamics, Taylor & Francis Groups, (2004).

\* cited by examiner

DUTY CYCLE INDEPENDENT REAL TIME DYNAMIC PROGRAMMING IMPLEMENTATION FOR HYBRID SYSTEMS CONTROLS OPTIMIZATION

CROSS REFERENCE TO RELATED APPLICATIONS

The present application claims benefit to U.S. provisional application 61/416,549 filed Nov. 23, 2010, the contents of which is incorporated herein in its entirety.

BACKGROUND

A system may be subject to multiple factors that influence the system, causing control of the system to be difficult. It is desirable that the multiple factors be taken into consideration when calculating control parameters such that system operation is stable and meets performance requirements. However, the computational resources allocated to the system may be incapable of considering enough of the influencing factors necessary to meet stability and performance requirements during operation.

One option for overcoming the issue of limited computational resources is to allocate additional resources. However, this option may be prohibitively expensive in terms of space, weight, or price, for example. Additionally, computational resources may not exist that are fast enough to react for systems in which the conditions or state of the system change rapidly, or for systems in which it is necessary to have the ability to rapidly change control parameters. Thus, simply adding more computational resources to the system may be insufficient.

Many systems with limited computational resources address the issue by designing the system for a certain set of expected conditions. However, if actual conditions are not as expected, system stability and/or performance may suffer. Thus it is preferable to have the capability to optimize control for stability and performance during system operation.

A solution for optimizing control during system operation without overburdening system computational resources reduces the number of calculations required during system operation.

BRIEF DESCRIPTION OF THE FIGURES

FIG. 5G illustrates an exemplary optimal path trajectory for time step to.

DETAILED DESCRIPTION

Figure 1:
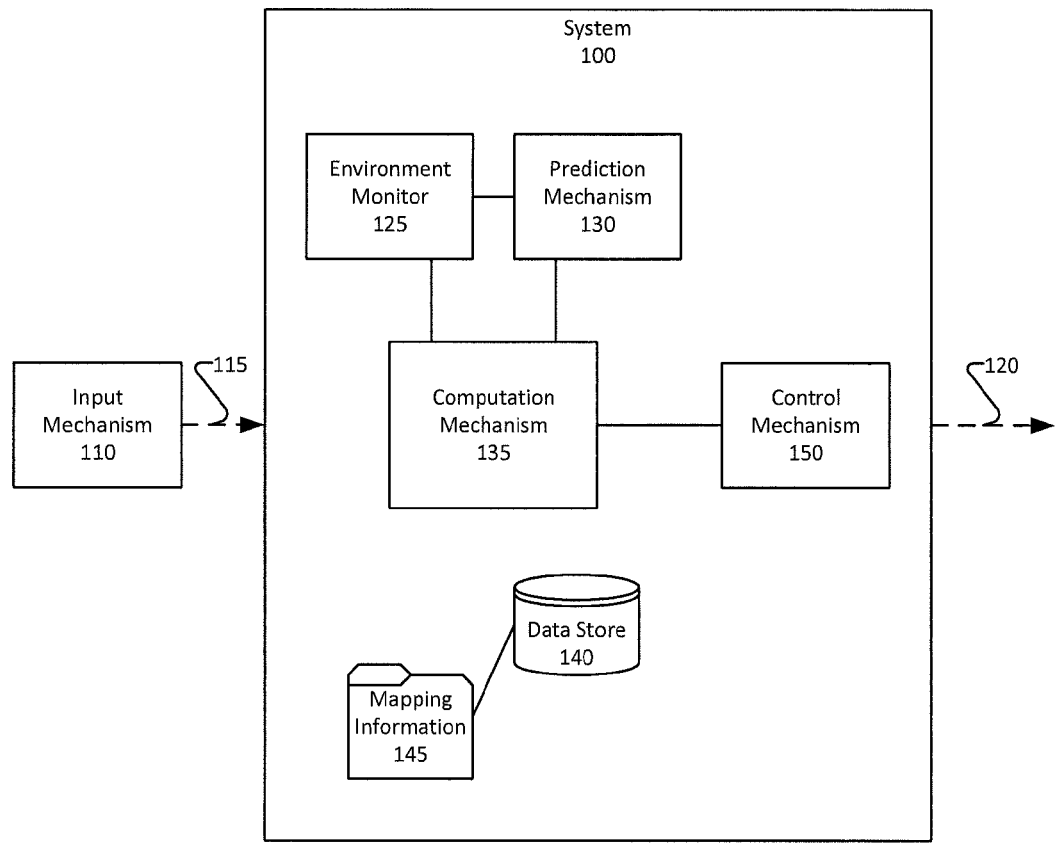
FIG. 1 illustrates an exemplary system for substantially real-time control during system operation.

A system may be described in terms of system environment, system control, and system response. System environment may include a set of environment conditions each with at least one state. System control may include a set of control parameters each with at least one state. Each configuration of control parameters applied to the system may cause a system response. The system response may cause the system environment conditions to change.

System response is influenced by many factors. In many systems, influences may be divided into two groups: influences related to the structure of the system and influences related to the environment of the system during operation. System response due to inherent structural influences may be calculated during system development, leaving only the system response related to environmental influences to calculate during system operation. Thus, the system computational resources may be minimized by not requiring the structural influences to be considered during system operation.

During development, the system structure may be modeled to aid in the calculation of the structural influences on system response. A model may be, for example, a computer model or a set of equations. The system model is supplied with starting environment conditions and control parameters. The model provides an expected structural response for the supplied starting conditions and control parameters. The model may use the expected structural response to provide expected ending environment conditions.

In a comprehensive analysis, each possible combination of environment conditions and control parameters may be supplied in turn to the model. A forward mapping may be made from the analysis including all starting environment conditions mapped to their ending environment conditions as functions of the control parameters. A forward mapping may include additionally or alternatively expected trajectories for the environment conditions based on the structural responses. A reverse mapping may use the information of the forward mapping to map each ending environment condition to possible starting environment conditions along with their associated functions of control parameters.

During operation, environmental influences on the system response may be calculated for the current environment conditions for each possible combination of control parameters. The current environmental influences may be combined with the structural influences calculated during development to determine a set of control parameters to apply that are expected to result in an optimized system response.

For a system that includes a prediction mechanism that predicts expected conditions for each step in a sequence out to a prediction horizon, the set of control parameters to apply at the current time may be determined using a backwards recursive method for determining optimized system responses. The recursion begins at the last step of the sequence to find an optimization and proceeds to the current time. At each step, the results of the previous step are used in the optimization.

In one illustrative example, a prediction mechanism provides a predicted drive cycle for a hybrid vehicle including an engine and a motor. The predicted drive cycle in this example may describe the expected speed that a driver will want for each of the next several time intervals, where speed is an environment of the system. The hybrid vehicle of the example may be modeled during development to determine the structural influences on system response. System response due to structural influences may include the amount of fuel required by the engine to increase speed from a first speed to a second speed, which is dependent on vehicle design factors. During vehicle operation, starting at the prediction horizon and calculating recursively back, a computation mechanism of the hybrid vehicle calculates optimized controls for each time interval. Controls may include, for example, engine torque and motor torque signals. Optimization may be for fuel efficiency, drivability, emissions, etc.

As illustrated by the previous example, optimization calculations may be performed in two stages, one stage during system development and one stage during system operation.

FIG. 1 illustrates an exemplary system 100 for substantially real-time control during system operation using information calculated during development. System 100 optionally receives from an input mechanism 110 requests 115. System 100 further optionally provides outputs 120 to other systems not shown.

System 100 represents any group of component parts that together perform a function or a set of functions. Thus, system 100 may represent mechanical systems, electrical systems, or biological systems, to name just a few examples.

System 100 may represent very small systems such as a surgical camera and tool encapsulated and swallowed for medical diagnosis and repair. System 100 may represent very large systems, such as an agricultural system or a satellite network. System 100 is any system that may be modeled.

Input mechanism 110 represents a capability to make requests 115 upon system 100 to perform one or more of its functions, to alter its performance, or to stop performing one or more of its functions.

In some implementations input mechanism 110 may represent a human-machine interface. One example of a human-machine interface is an electrical system in which input mechanism 110 includes one or more of a keyboard, mouse, microphone, or other device that allows a human to enter instructions into a computing device. As another example of a human-machine interface, input mechanism 110 may include a mechanical lever mechanism like an accelerator pedal for adjusting performance and keys or press-buttons or the like for starting and stopping operation.

In some implementations input mechanism 110 may represent an automated interface, such as instructions programmed into a computing device for issuing requests 115 at certain times or under certain conditions, or physical structures in a mechanical device that respond to changes in the environment by making physical contact with system 100. An automated interface may include the environment itself, such as vibration applied to system 100.

In some implementations there is no input mechanism 110, such that system 100 operates in a self-contained mode to perform its functionality.

Requests 115 may be received in many different forms as appropriate for communicating from input mechanism 110 to system 100, as seen from the examples above.

One example of a system 100 discussed in detail below is a power source for a hybrid vehicle, wherein the function of system 100 is to move the vehicle in response to requests 115 from a driver such as requests 115 for acceleration or deceleration. In this example, system 100 may be one of multiple systems 100 controlling the vehicle. Other systems 100 in the vehicle may include functionality for regenerative braking, steering, climate control, battery monitoring, etc.

Outputs 120 represent optional information provided by system 100. Outputs 120 may be, for example, control information or signals, status information, mechanical forces, chemicals, cell growth, crops, or any other output that system 100 is capable of producing.

System 100 includes an environment monitor 125, a prediction mechanism 130, a computation mechanism 135, a data store 140, mapping information 145, and a control mechanism 150.

Environment monitor 125 collects knowledge of the current environment conditions of system 100. Environment conditions may include internal conditions of system 100 such as speed, device status and health, device temperature, control parameter state, position, trajectory, yaw, pitch, roll, acceleration and deceleration, height, weight, growth rate, expansion, conversion step, etc. Environment conditions may also include physical environment conditions such as air temperature, atmospheric pressure, air particulate counts, relative air humidity, chemical composition of the environment, etc.

The term "current" in "current environment conditions" indicates a relative value. For systems in which the environment changes very slowly, for example the temperature of the polar ice cap, "current" may refer to information collected days or weeks prior. For systems in which the environment changes very rapidly, for example the position of a spacecraft, "current" may refer to information collected in the last milliseconds. In some implementations, environment monitor 125 may retain history or trend information.

Prediction mechanism 130 generates predictions for environment conditions based, for example, on one or more of knowledge of current environment conditions from environment monitor 125, information received in requests 115, trend or history information, and stored predictions. As one example, a prediction may be that in ten seconds the driver will be approaching a stop sign based on current vehicle speed, the force applied by a driver to an accelerator pedal, and the drive cycle information from the previous thirty seconds. In another example, based on a person's age, current assets, current income, and spending history, a prediction may be that the person will retire in 12 years and expect to have four million dollars in the bank at retirement.

Computation mechanism 135 represents computational facilities for using information from environment monitor 125, prediction mechanism 130, and requests 115 to generate controls for system 100. In many implementations, computation mechanism 135 represents a computing device. In other implementations, computation mechanism 135 may represent, for example, mechanical structures or neural networks.

In general, computing systems and/or devices may employ any of a number of well-known computer operating systems, including, but by no means limited to, known versions and/or varieties of the Microsoft Windows® operating system, the Unix operating system (e.g., the Solaris® operating system distributed by Sun Microsystems of Menlo Park, Calif.), the AIX UNIX operating system distributed by International Business Machines of Armonk, N.Y., and the Linux operating system. Examples of computing devices include, without limitation, a computer workstation, a server, a desktop, notebook, laptop, or handheld computer, an electronic control unit in a vehicle, or some other known computing system and/or device.

Computing devices generally include computer-executable instructions, where the instructions may be executable by one or more computing devices such as those listed above. Computer-executable instructions may be compiled or interpreted from computer programs created using a variety of well-known programming languages and/or technologies, including, without limitation, and either alone or in combination, Java™, C, C++, Visual Basic, Java Script, Perl, etc. In general, a processor (e.g., a microprocessor) receives instructions, e.g., from a memory, a computer-readable medium, etc., and executes these instructions, thereby performing one or more processes, including one or more of the processes described herein. Such instructions and other data may be stored and transmitted using a variety of known computer-readable media.

A computer-readable medium (also referred to as a processor-readable medium) includes any non-transitory (e.g., tangible) medium that participates in providing data (e.g., instructions) that may be read by a computer (e.g., by a processor of a computer). Such a medium may take many forms, including, but not limited to, non-volatile media and volatile media. Non-volatile media may include, for example, optical or magnetic disks and other persistent memory. Volatile media may include, for example, dynamic random access memory (DRAM), which typically constitutes a main memory. Such instructions may be transmitted by one or more transmission media, including coaxial cables, copper wire and fiber optics, including the wires that comprise a system bus coupled to a processor of a computer. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, or any other medium from which a computer can read.

Data store 140 may include information stored by and/or used by environment monitor 125, prediction mechanism 130, computation mechanism 135, control mechanism 150, and/or any other components of system 100.

Databases, data repositories or other data stores described herein may include various kinds of mechanisms for storing, accessing, and retrieving various kinds of data, including a hierarchical database, a set of files in a file system, an application database in a proprietary format, a relational database management system (RDBMS), etc. Each such data store is generally included within a computing device employing a computer operating system such as one of those mentioned above, and are accessed via a network in any one or more of a variety of manners, as is known. A file system may be accessible from a computer operating system, and may include files stored in various formats. An RDBMS generally employs the known Structured Query Language (SQL) in addition to a language for creating, storing, editing, and executing stored procedures, such as the PL/SQL language mentioned above.

In some examples, system elements may be implemented as computer-readable instructions (e.g., software) on one or more computing devices (e.g., servers, personal computers, etc.), stored on computer readable media associated therewith (e.g., disks, memories, etc.). A computer program product may comprise such instructions stored on computer readable media for carrying out the functions described herein.

Data store 140 includes mapping information 145.

Mapping information 145 is a description of the relationship between environment conditions and control parameters of control mechanism 150. For example, a description of the relationship may include the effect that each combination of control parameters is expected to have given the environment conditions. Mapping information 145 is discussed in detail below. Computation mechanism 135 may use mapping information 145 in combination with predictions from prediction mechanism 130 and environment conditions from environment monitor 125 to determine control parameters for control mechanism 150, as is described in detail below.

System 100 further includes a control mechanism 150 for controlling system 100. Control mechanism 150 may include multiple components in communication with each other, either by physically exerting force on or otherwise influencing each other, or by exchanging information with each other. Thus, control mechanism 150 may include many forms of control. A few representative illustrative examples of control include applying torque to wheels, using hydraulic, electric, kinetic, spring, or magnetic energy to apply force to a component, applying water to crops, adding chemicals to a compound, introducing medication to an intravenous drip, and adjusting ailerons of an airplane wing.

In sum, environment monitor 125 gathers environment conditions, prediction mechanism 130 makes predictions based on the environment conditions and/or other information, and computation mechanism 135 uses the environment conditions, the predictions, and/or other information to determine control parameters.

As discussed, for substantially real-time control of a system 100 with influences that may be divided into structural influences and environmental influences, heuristics may be divided into two stages. The first stage is a mapping related to structural influences, performed during development of system 100. The second stage is a mapping related to environmental influences and an optimization, performed during system 100 operation. FIGS. 2A-2E illustrate mapping at a simple level to introduce the concept and the terminology of the first stage.

Figure 2A:
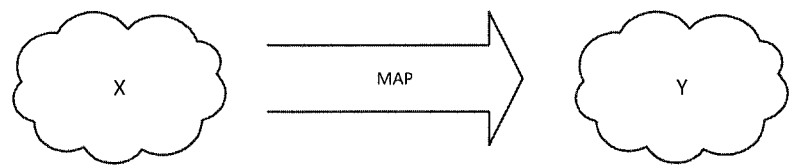
FIG. 2A illustrates an exemplary mapping of a set X of environment conditions onto a set Y of environment conditions when a configuration of control parameters is applied to a model of a system.

FIG. 2A illustrates the mapping of a set X of environment conditions onto a set Y of environment conditions when a configuration of control parameters is applied to a model of a system 100. Set X and set Y may include the same environment conditions, but in some implementations may include different environment conditions. Further, one set X or Y may be a subset of the other. An environment condition in set X or Y may be continuous such that there are infinite states for the condition, or may be discrete such that are a finite number of states for the condition.

Figure 2B:
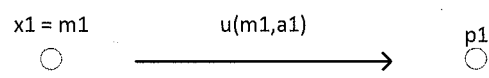
FIG. 2B illustrates an exemplary set of conditions X with one condition x1 that has one state m1, and a control parameter with one state.

FIG. 2B illustrates a set of conditions X with one condition x1 that has only one state m1. A single control parameter with one state a1 is applied to the model. The structural system response causes environment condition p1, where p1 represents a state of a condition y in the set of conditions Y. Thus, x1 state m1 maps to p1 when a1 is applied. The function u(m1, a1) represents the cost of the associated system response.

Figure 2C:
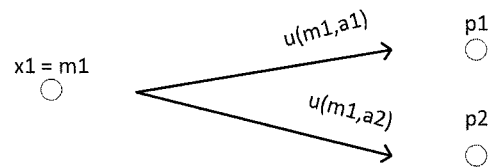
FIG. 2C illustrates an exemplary set of conditions X with one condition x1 that has one state m1, and a control parameter with two states.

FIG. 2C illustrates a set of conditions X with one condition x1 that has only one state m1. A single control parameter has two states a1 and a2. Control parameter state a1 is applied to the model with initial condition m1, resulting in a structural system response that causes environment condition p1, where p1 represents a state of a condition y in the set of conditions Y. Control parameter state a2 is applied to the model with initial condition m1, resulting in a structural system response that causes environment condition p2, where p2 represents another state of condition y in the set of conditions Y. Thus, control parameter states a1 and a2 map m1 to p1 or p2, respectively. The functions u(m1, a1) and u(m1, a2) represent the cost of each associated system response.

Figure 2D:
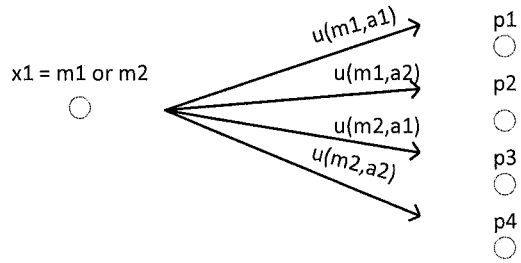
FIG. 2D illustrates an exemplary set of conditions X with one condition x1 that has two states m1 and m2, and a single control parameter with two states a1 and a2.

FIG. 2D illustrates a set of conditions X with one condition x1 that has two states m1 and m2, and a single control parameter with two states a1 and a2. The environment condition x1 is set to m1 and control parameter state a1 is applied to the model, resulting in a structural system response that causes environment condition p1. The control parameter state a2 is then applied to the model with initial condition m1, resulting in a structural system response that causes environment condition p2. The environment condition x1 is then set to m2 and control parameter state a1 is applied to the model, resulting in a structural system response that causes environment condition p3. The control parameter state a2 is applied to the model with initial condition m2, resulting in a structural system response that causes environment condition p4. In this example, p1, p2, p3, and p4 represent states of a condition y in the set of conditions Y. The mapping of set X to set Y is illustrated in FIG. 2D. The functions u(m1, a1), u(m1, a2), u(m2, a1), and u(m2, a2) represent the cost of each associated system response.

FIGS. 2B-2D illustrated simple mapping of one condition x1 with one state m1 or two states m1, m2 to one condition y with at least one states p1, p2, p3, p4. In other implementations, one condition x1 may map to multiple conditions y in the set of conditions Y. Further, in yet other implementations, multiple conditions x may map to multiple conditions y.

Figure 2E:
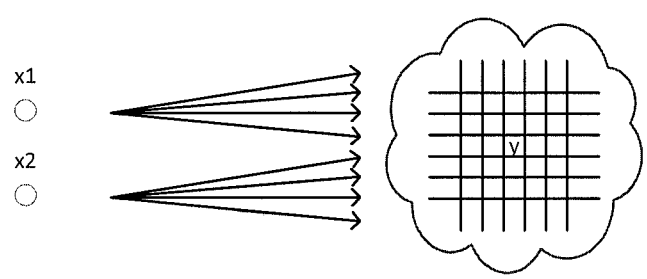
FIG. 2E illustrates an exemplary set of conditions X including multiple conditions.

FIG. 2E illustrates increasing complexity as set X includes additional environment conditions. In this example, set X includes two conditions, x1 and x2. Control parameters are applied to the model, resulting in system responses that map x1 and x2 to multiple conditions or condition states in set Y. Clearly, increasing any of the number of conditions x in the set of conditions X, the number of conditions y in the set of conditions Y, and/or the number of states of any of the conditions x or y increases the complexity of the calculations.

More complexity generally requires more computational resources. Thus, it is desirable to perform as much of the calculation as possible during development when adequate computational resources may be readily available in an optimal computational environment. Further, computation performed during system development does not generally require real-time calculation. In contrast, computation performed during system operation may require substantially real-time calculation to adequately provide system control.

In each of the examples of FIGS. 2B-2E, conditions x of set X are discrete values. The discrete values for x may map to infinite values y in set Y. The example illustrated in FIG. 2E shows that set Y may be discretized, such that each value for y may be mapped to a discrete value close to the calculated value.

A hybrid vehicle control system provides an illustrative example of mapping in which there are two power sources, for example an internal combustion engine and an electric motor. The hybrid vehicle environment may include the condition rate of change of speed, which may have an infinite number of states. The hybrid vehicle control parameters may include engine torque, which may have an infinite number of states. To simplify this example, speed rate of change is limited to the two states <acceleration> and <deceleration>, and engine torque is limited to the two states <increase torque> and <decrease torque>.

Continuing with the hybrid vehicle example, a model of the system may be supplied with the initial condition state <acceleration>, and the parameter state <increase torque>. The model provides an expected system response that leads to the expected ending environment condition state <acceleration>. A forward mapping of this result may appear as [<acceleration>; <increase torque>→<acceleration>]. Following the same process for each other configuration of environment conditions and parameters, a complete forward mapping of the system may appear as shown in (1)-(4):

$$[<acceleration>;<increase\ torque>\rightarrow<acceleration>] \quad (1)$$

$$[<acceleration>;<decrease\ torque>\rightarrow<deceleration>] \quad (2)$$

$$[<deceleration>;<increase\ torque>\rightarrow<acceleration>] \quad (3)$$

$$[<deceleration>;<decrease\ torque>\rightarrow<deceleration>] \quad (4)$$

In some implementations, a reverse mapping may be used in optimization calculations. A reverse mapping may be made from the forward mapping by finding for each ending environment condition state the starting environment condition state and the corresponding control parameter state. For example, <acceleration> appears as an ending state in (1) and (3). Thus, a reverse mapping for <acceleration> would map to the starting condition states and the parameters of (1) and (3). A reverse mapping of the system may appear as shown in (5) and (6):

$$[<acceleration>\leftarrow<acceleration>;<increase\ torque>OR<deceleration>;<increase\ torque>] \quad (5)$$

$$[<deceleration>\leftarrow<acceleration>;<decrease\ torque>OR<deceleration>;<decrease\ torque>] \quad (6)$$

At the end of the first stage, during development, there is at least one mapping describing at least in part the structural influences on system response. The mapping or mappings may be stored as mapping information 145 in data store 140. In the second stage, during system operation, environmental influences on system response are mapped in a manner similar to the mapping described above. The second stage mapping and the first stage mapping are then used to determine an optimized set of control parameters to apply.

Figure 3A:
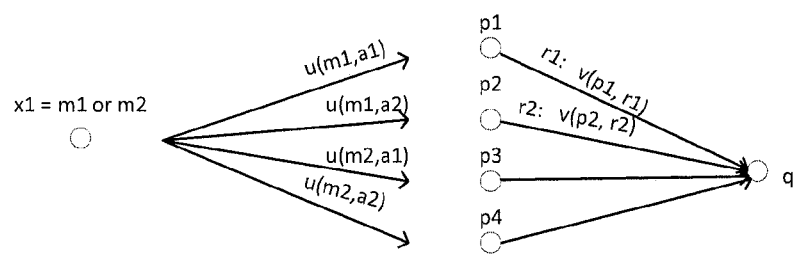
FIG. 3A illustrates exemplary second stage calculations.

FIG. 3A illustrates second stage calculations with a simple example of a system including a single environment condition x1 with two states m1 and m2, and a single control parameter with two states a1 and a2, as described with respect to FIG. 2D. During system operation the state m1 or m2 of condition x1 is known. The costs u(m1, a1), u(m1, a2), u(m2, a1), and u(m2, a2) are known from the first stage mapping. Given a desired environment condition end state q, an optimal control parameter state may be determined to result in that end state.

In this example, if condition x1 is in state m1, the cost of applying the control parameter is either u(m1, a1) or u(m1, a2) and the ending environment condition state is p1 or p2, respectively. State p1 is a distance r1 from desired end state q and there is an error cost v(p1, r1) associated with p1 being distance r1 from q. A total cost for applying control parameter state a1 with initial condition state m1 includes the stage 1 cost u(m1, a1) plus the error cost v(p1, r1), as illustrated in equation (7). State p2 is a distance r2 from desired end state q and there is an error cost v(p2, r2) associated with p2 being distance r2 from q. A total cost for applying control parameter state a2 with initial condition state m1 includes the stage 1 cost u(m1, a2) plus the error cost v(p2, r2), as illustrated in equation (8).

$$TotalCost(m1,a1)=u(m1,a1)+v(p1,r1) \quad (7)$$

$$TotalCost(m1,a2)=u(m1,a2)+v(p2,r2) \quad (8)$$

TotalCost( ) may be a weighted sum of u( ) and v( ) as illustrated in equations (9) and (10), where variables b and c are weighting factors.

$$TotalCost(m1,a1)=b*u(m1,a1)+c*v(p1,r1) \quad (9)$$

$$TotalCost(m1,a2)=b*u(m1,a2)+c*v(p2,r2) \quad (10)$$

In the example of FIG. 3A, an optimization calculation may be to find the minimum of TotalCost(m1, a1) and Total-Cost(m1, a2), as illustrated in equation (11). The optimization represents the lowest cost for starting from condition x1 state m1 and ending at state q.

$$Opt(m1,q)=\min[TotalCost(m1,a1) \text{ and } TotalCost(m1,a2)] \quad (11)$$

The error cost v(p, r) associated with calculated condition state p being a distance r from desired condition state q may be retrieved from a table of costs or calculated from a cost equation. In some implementations, the error cost v(p, r) may be solely a function of distance r. In other implementations, the error cost v(p, r) may be a function of distance r and condition state p. An example of a system 100 is a vehicle in which p represents speed, r represents the difference between speed p and desired speed q, and error cost v(p, r) represents driver irritation that may be caused due the vehicle being faster or slower than desired. In this example, driver irritation may be more at low speeds than it would be at high speeds for the same difference in speed, and optimization as described by equation (11) may include minimizing driver irritation. Another error cost v(p, r) for the vehicle of the example may be additional fuel required to increase the speed to meet the desired speed q, and optimization may include maximizing fuel efficiency. As indicated by this example, there may be multiple costs v(p, r) for a system 100. Optimization may be performed for one or more costs.

It may be desirable to determine an optimization for the desired end state q over every combination of control parameters and starting environment conditions.

Figure 3B:
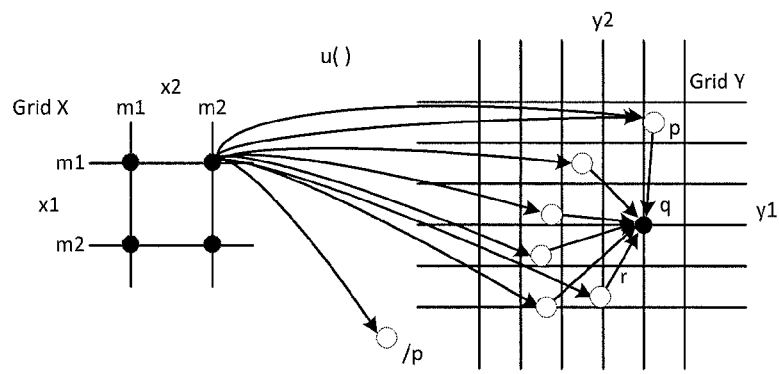
FIG. 3B illustrates an exemplary two-dimensional grid X representing two states each for two environmental conditions x1 and x2 and a multi-dimensional grid Y representing multiple states each for two environmental conditions y1 and y2.

FIG. 3B illustrates a two-dimensional grid X representing two states each for two environmental conditions x1 and x2 and a multi-dimensional grid Y representing multiple states each for two environmental conditions y1 and y2. FIG. 3B represents a continuous mapping onto grid Y. As mentioned above, however, during the first stage mapping, points p may be mapped to the closest discrete point on grid Y.

A desired end point q is shown on grid Y. As illustrated, the starting conditions are x1 state m2 and condition x2 state m2. With these starting conditions, each control parameter state applied causes a system response leading to a point p on grid Y according to the stage 1 mappings. As illustrated in FIG. 3B, more than one combination of control parameters may result in mapping to a point p on grid Y. Also illustrated in FIG. 3B is that some combinations of control parameters result in mapping to a point /p that is outside the acceptable limits for conditions p as represented by the grid Y.

Each system response has an associated cost function u( ) as determined in stage 1 and an error cost v( ) as calculated in stage 2 from the difference r between point p and desired end point q. A TotalCost is determined for each path from the starting conditions to point q in Grid Y, where each path relates to one combination of control parameters. TotalCost is calculated based at least on cost functions u( ) and v( ). An optimal path is determined from the set of paths based on the TotalCost of each path, for example by selecting the path with the minimum TotalCost. Thus, each gridpoint of Grid X representing starting conditions for system 100 is associated with an optimal path to desired end point q. The optimal paths for each gridpoint of Grid X may be stored. For example, the starting environment conditions of Grid X associated with the optimal path, the control parameters applied to achieve the optimal path, the end point on grid Y for the optimal path, and the TotalCost associated with the optimal path may be stored for use in further calculations.

Figure 3C:
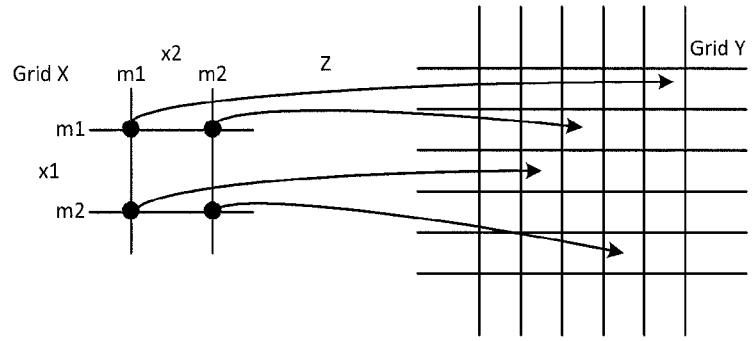
FIG. 3C illustrates exemplary information that may be stored for one exemplary set Z of optimal paths.

FIG. 3C illustrates information that may be stored for one exemplary set Z of optimal paths. In this example, for each gridpoint of Grid X the trajectory of the system response related to the optimal path for that gridpoint is stored. The trajectory end point, the minimum TotalCost, and the control parameters of the optimal path may also be stored as mentioned above.

The example illustrated in FIGS. 3B and 3C describes determining an optimal path to reach a desired end point q, where end point q is the desired next state for system 100. In some systems 100, a prediction mechanism 130 predicts the desired states q for multiple times in the future out to a time N. In such systems 100, a set Z1 of optimal paths are determined at time N−1 for each gridpoint of Grid X as described above. The set Z1 of optimal paths at time N−1 are used in the calculation of a set Z2 of optimal paths at time N−2, and so on back to the current time. Thus, the optimal path calculation is used recursively to determine the controls to apply to system 100 at the starting time.

Figure 4:
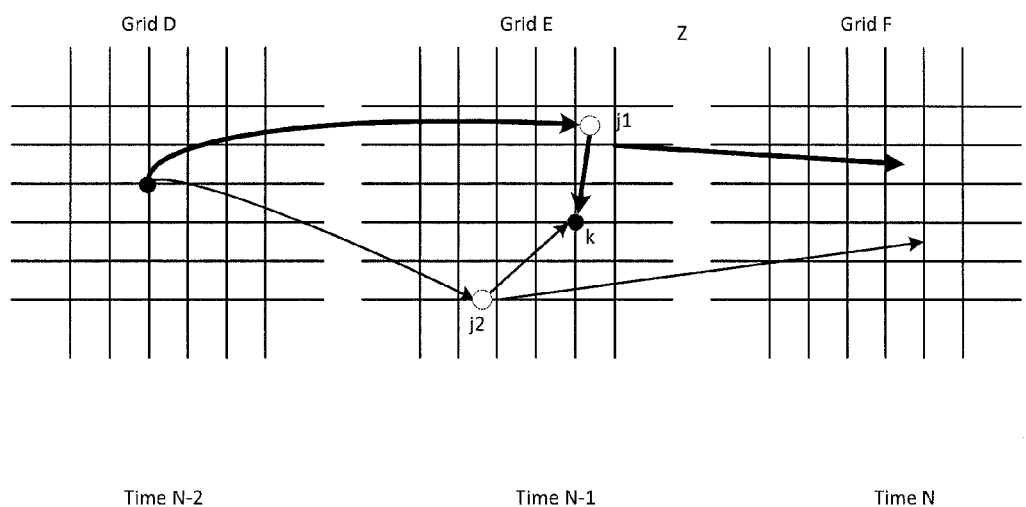
FIG. 4 illustrates an exemplary determination of a set Z of optimal paths for time step N−2.

FIG. 4 illustrates the determination of one optimal path of a set of optimal paths originating at time step N−2. The determination includes heuristics at time step N−1 and then at time step N−2. In particular, the heuristics include the use of a set Z of optimal paths originating in time step N−1 in determining a set of optimal paths originating in time step N−2.

For time step N−1:

A set Z of optimal paths originating from the gridpoints of Grid E and terminating at Grid F at time step N is calculated, as described above. The set Z of optimal paths may include an optimal path for each gridpoint of Grid E. Two optimal paths in the set Z of optimal paths for time N−1 is illustrated in FIG. 4. Each optimal path has an associated TotalCost as described above. For ease of the following discussion of FIG. 4, the TotalCost previously calculated for an optimal path for a gridpoint of Grid E is referred to as OptTotalCost.

For time step N−2:

As a first step, Grid D is related to Grids E and F. In some implementations, Grids D, E, and F represent the same environmental conditions and states and may have direct gridpoint to gridpoint relationships. In other implementations other relationships may apply. For ease of discussion, the Grids D, E, and F have a direct gridpoint to gridpoint relationship in the following discussions. Thus, for example, a point h on Grid E (not shown) represents the same environment conditions as a corresponding point h on Grids D and F (not shown).

In a next step, at each gridpoint on Grid D representing the environment conditions at time step N−2, TotalCost is calculated as described above for each combination of control parameters. TotalCost is based on at least a first stage cost function u( ) to reach a point j mapped onto Grid E and a second stage error cost function v( ) for the difference between j and desired end point k on Grid E.

In a next step, for each point mapped onto Grid E in the previous step, for example, points j1 and j2 in FIG. 4, the optimal path originating from the starting conditions represented by the mapped point is recalled from the calculations of time step N−1. For example, OptTotalCost for the optimal path originating from points j1 and j2 is read from a memory.

In a next step, recursive total RecTotalCost is calculated by adding the recalled OptTotalCost from time step N−1 to TotalCost calculated at time step N−2 for the system response related to the applied control parameters. For example, RecTotalCost for point j1 is calculated by adding OptTotalCost for j1 at time step N−1 to TotalCost determined for the combination of control parameters and environment conditions at time step N−2 resulting in the environment conditions at point j1 in time step N−1. RecTotalCost thus represents the entire expected cost for one path starting at a given set of environment conditions at time step N−2 and ending with a set of environment conditions at time step N, including error costs related to the predicted conditions for time steps N and N−1. The bold lines in FIG. 4 indicate the components of RecTotalCost including error cost.

For each gridpoint, an optimal recursive path is determined based at least in part on the RecTotalCost related to each combination of control parameters applied at time step N−2. The optimal recursive path indicates the control parameters to apply at time step N−2.

An optimal recursive path for time step N−3 may be determined by adding RecTotalCost determined for time step N−2 to TotalCost for time step N−3. In the same manner, optimal recursive paths may be determined at each time step backwards to the current time. The number of time steps is limited by available computational resources.

If optimal recursive paths are calculated back to the current time, then control parameters to apply at the current time may be determined that are calculated to result in an optimized path to a predicted environment at time step N. Of course, many factors may influence the actual system response and therefore calculations may be performed again as actual system response is known to adjust for influences not included in the optimization heuristic.

FIGS. 5A-5G provide an illustrative example for determining the engine torque to apply based in part on a prediction for the desired speed of a vehicle in the next three time steps. In this example, the single environment condition is speed with six states S0, S1, S2, S3, S4, and S5. The single control parameter is engine torque with three states. A prediction mechanism 130 has provided speed predictions j1=S1, j2=S2, and j3=S5 for the future time steps t1, t2, and t3, respectively. The vehicle is currently at speed state S0. In the example of FIGS. 5A-5G, the information calculated during development regarding system response due to structural influences is available. Specifically in this example, cost and trajectory of the system response are available.

Figure 5A:
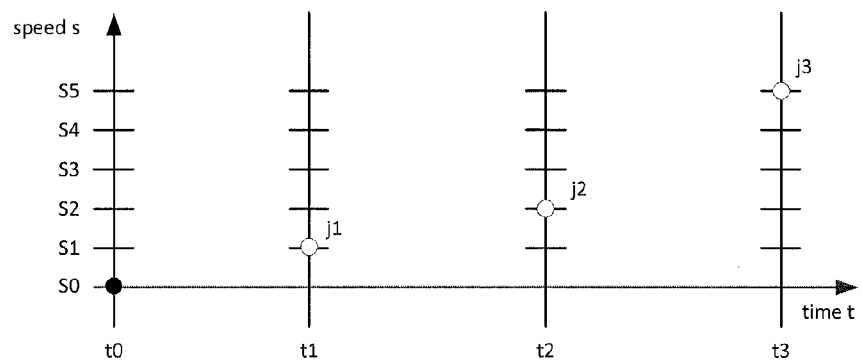
FIG. 5A illustrates exemplary speed states, time steps, and speed state predictions on a graph in which the horizontal axis represents time and the vertical axis represents speed.

FIG. 5A illustrates the speed states, the time steps, and the predictions on a graph in which the horizontal axis represents time and the vertical axis represents speed. The time steps along the time axis may be spaced equally as illustrated or unequally, and the time difference between time steps may be small or large. The speed states along the speed axis may be spaced equally as illustrated or unequally, and the speed difference between speed states may be small or large.

Figure 5B:
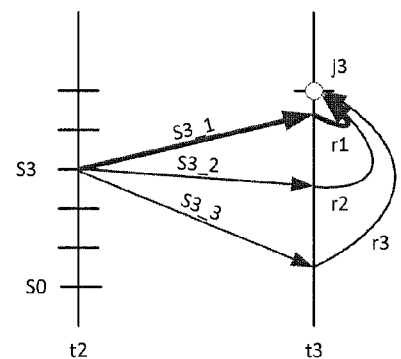
FIG. 5B illustrates an exemplary portion of the calculations performed at time step t2 based on the predicted speed for time step t3.

FIG. 5B illustrates a portion of the calculations performed at time step t2 based on the predicted speed for time step t3. Only calculations related to speed state S3 are shown, however calculations may be performed in similar fashion for each other time step. For a first state of the engine torque states, the system response calculated during development for speed S3 and the engine torque state 1 is retrieved, for example, read from memory. The trajectory of the system response starting at speed S3 and applying engine torque state 1 is shown in FIG. 5B as S3_1. Where the trajectory S3_1 meets the vertical axis at time step t3 is the expected speed when starting speed is S3 and engine torque state 1 is applied at time step t2. The expected speed may be retrieved as part of the system response or may be calculated during operation.

The difference between the expected speed and the predicted speed j3=S5 is calculated, resulting in difference r1. An error cost is determined from r1. The error cost is added to the cost of trajectory S3_1 calculated during development to determine a total cost for trajectory S3_1 for predicted speed j3.

In some implementations, there is a terminal cost associated with time step N which is included in the total cost. Thus, for the example of FIG. 5B, there may be a terminal cost associated with each gridpoint at time step t3. To illustrate, trajectory S3_1 meets the vertical axis at time step t3 at an endpoint of the trajectory. A heuristic may select one of the speed states at time step t3 near the endpoint of the trajectory, and add the terminal cost associated with that selected speed state to the total cost of the trajectory. Alternatively, an heuristic may interpolate a terminal cost from the terminal costs associated with the speed states above and below the end point of trajectory S3_1 and add the interpolated terminal cost to the total cost of the trajectory.

For a second state of the engine torque states, expected speed at time step t3 is calculated from trajectory S3_2, an error cost is calculated from the difference r2 between expected speed and predicted speed j3, and a total cost for trajectory S3_2 is calculated from the error cost and the cost of trajectory S3_2.

For a third state of the engine torque states, expected speed at time step t3 is calculated from trajectory S3_3, an error cost is calculated from the difference r3 between expected speed and predicted speed j3, and a total cost for trajectory S3_3 is calculated from the error cost and the cost of trajectory S3_3.

The minimum total cost for each of trajectories S3_1, S3_2, and S3_3 is then determined. In FIG. 5B, the minimum is the total cost of the system response cost of trajectory S3_1 plus the error cost associated with r1, thus S3_1 and r1 are highlighted in bold. S3_1 is designated as the optimal path from speed S3 at time step t2 for predicted speed j3 at time step t3.

Optimal paths may be determined for one or more of the remaining speed states S0, S1, S2, S4, and S5 in the manner described for speed state S3. Information regarding the optimal paths may be stored. For example, the trajectory, the end point of the trajectory, the engine torque state, and the total cost of the trajectory may be stored.

Figure 5C:
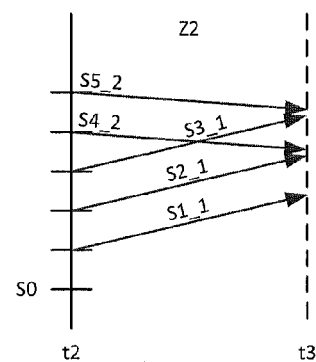
FIG. 5C illustrates an exemplary set of optimal paths for speed states S1-S5 at time step t2.

FIG. 5C illustrates exemplary optimal paths for speed states S1-S5 at time step t2, including the optimal path S3_1 determined above.

Figure 5D:
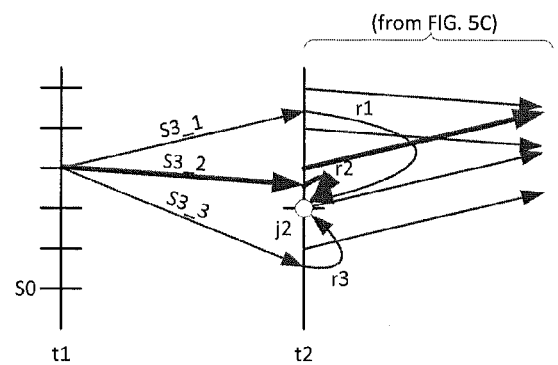
FIG. 5D illustrates exemplary calculations performed at time step t1 using optimal paths from time step t2.

FIG. 5D illustrates the calculations performed at time step t1 using the optimal paths illustrated in FIG. 5C. The calculations are illustrated for speed state S3. As described above, a total cost for trajectory S3_1 is calculated. However, in this calculation, the difference r1 represents the difference between the expected speed at time step t2 for trajectory S3_1 and the predicted speed j2 at time step t2.

A recursive total cost for trajectory S3_1 is then calculated by selecting the optimal path originating from the speed state nearest the expected speed for S3_1 at time step t2 and adding the optimal path total cost to the total cost for trajectory S3_1. In a similar manner, a recursive total cost is calculated for trajectory S3_2 and trajectory S3_3.

The minimum recursive total cost is calculated. In FIG. 5D, the minimum recursive total cost was calculated as the recursive total cost for trajectory S3_2 as indicated by the bold lines. The recursive total cost for trajectory S3_2 includes the cost of the system response for trajectory S3_2, the error cost related to difference r2, and the optimal path originating from speed S3 at time t2. Thus, trajectory S3_2 is selected as the optimal path from speed S3 at time step t1 for predicted speed j2 at time step 2.

Optimal paths may be determined for one or more of the remaining speed states S0, S1, S2, S4, and S5 in the manner described for speed state S3. Information regarding the optimal paths may be stored.

Figure 5E:
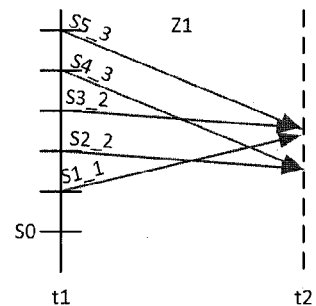
FIG. 5E illustrates an exemplary set of optimal paths for speed states S1-S5 at time step t1.

FIG. 5E illustrates optimal paths for speed states S1-S5 at time step t1, including the optimal path S3_2 determined above.

Figure 5F:
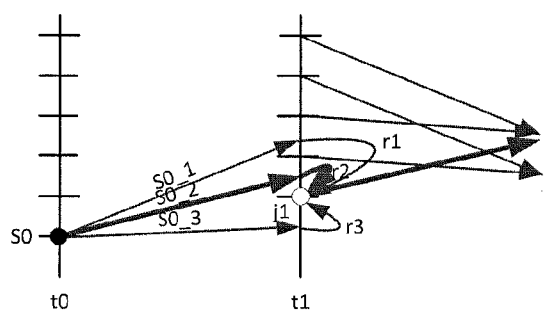
FIG. 5F illustrates exemplary calculations performed at time step t0 using optimal paths from time step t1.

FIG. 5F illustrates the calculations performed at time step t0 using the optimal paths illustrated in FIG. 5E. The calculations are performed for current speed state S0 only. A total cost for trajectory S0_1 is calculated for engine torque state 1. The difference r1 represents the difference between the expected speed at time step t1 for trajectory S0_1 and the predicted speed j1 at time step t1.

A recursive total cost for trajectory S0_1 is then calculated by selecting the optimal path originating from the speed state nearest the expected speed for S0_1 at time step t1 and adding the optimal path total cost to the total cost for trajectory S0_1. In some implementations, a heuristic interpolates between optimal path total costs for speed states near the expected speed, and the interpolated optimal cost is added to the total cost.

In a similar manner, a recursive total cost is calculated for trajectory S0_2 and trajectory S0_3.

The minimum recursive total cost is calculated. In FIG. 5F, the minimum recursive total cost was calculated as the recursive total cost for trajectory S0_2 as indicated by the bold lines. The recursive total cost for trajectory S0_2 includes the cost of the system response for trajectory S0_2, the error cost related to difference r2, and the optimal path originating from speed S1 at time t1. Thus, trajectory S0_2 is selected as the optimal path from current speed S0 at time step t0 for predicted speed j1 at time step t1.

Figure 5G:
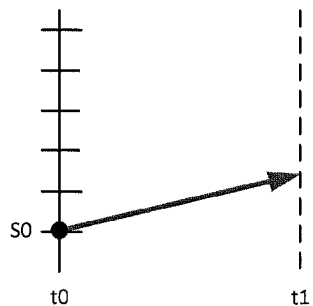

FIG. 5G illustrates optimal path trajectory S0_2, representing the expected system response of applying engine torque state 2 at current time t0 with starting speed S0. Thus, the control parameter to be applied at the current time is engine torque state 2 for optimized performance in reaching predicted speeds j1, j2, and j3 at time steps t1, t2, and t3, respectively.

The example of FIGS. 5A-5G considered speed with six speed states as the only environment condition, and engine torque with three states as the only control parameter. Vehicle control systems, and systems 100 in general, may consider a large number of environment conditions and control parameters, each with many states. To reduce the number of calculations required at each time step, the calculations may be limited to certain condition states or certain control parameter states. For example, if predicted speed at time step t5 is sixty miles per hour (60 MPH), then calculations at time step t4 may be limited to the starting environment condition states in the range 55 MPH-65 MPH. As another example, if battery charge is an environment condition and motor torque is a control parameter, and if the state of battery charge indicates low charge at time t0, then calculations at time step t4 may be limited to motor torque states representing low applied torque.

Figure 6:
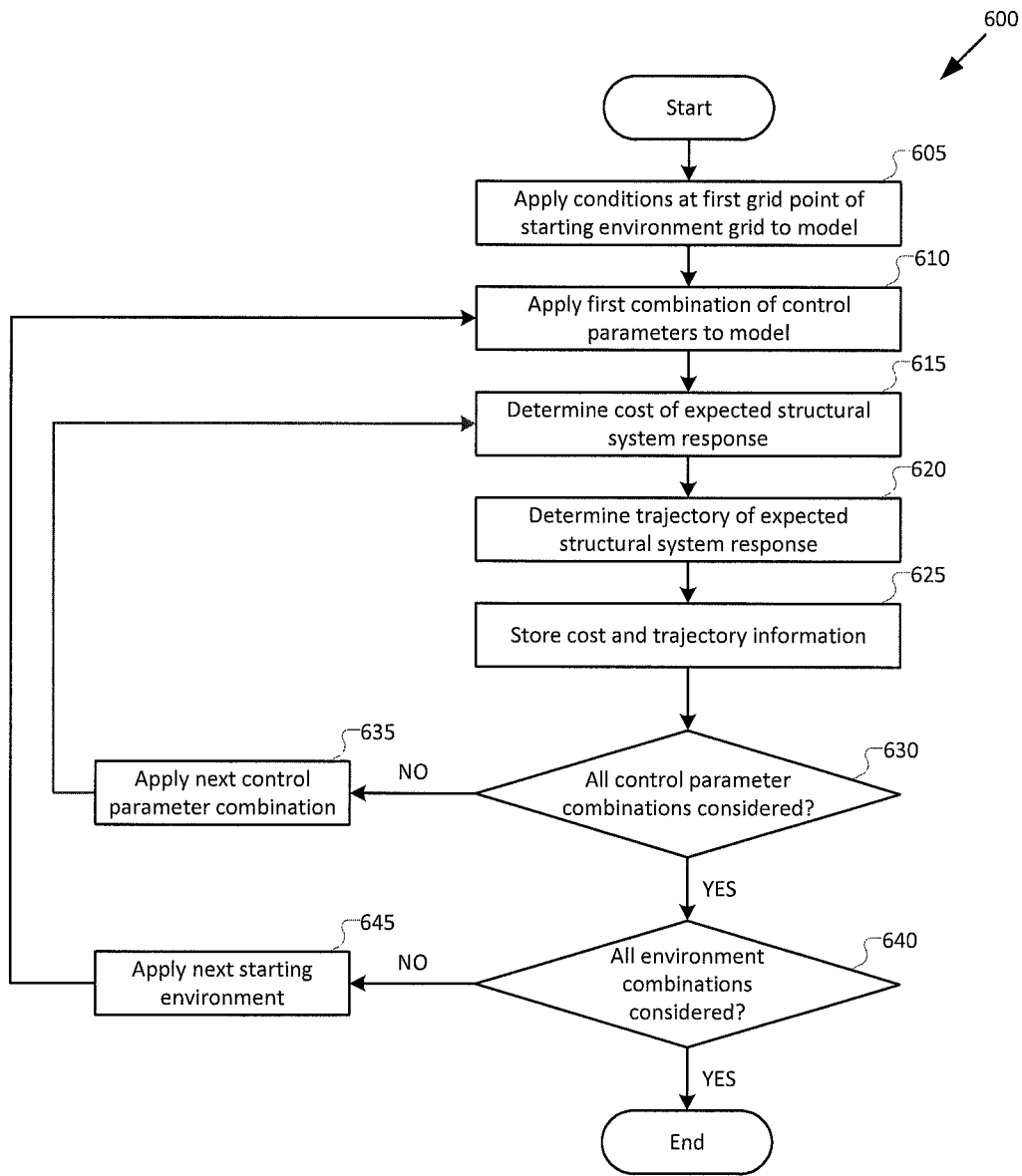
FIG. 6 illustrates an exemplary process for calculating expected system response related to structural influences.
Figure 7:
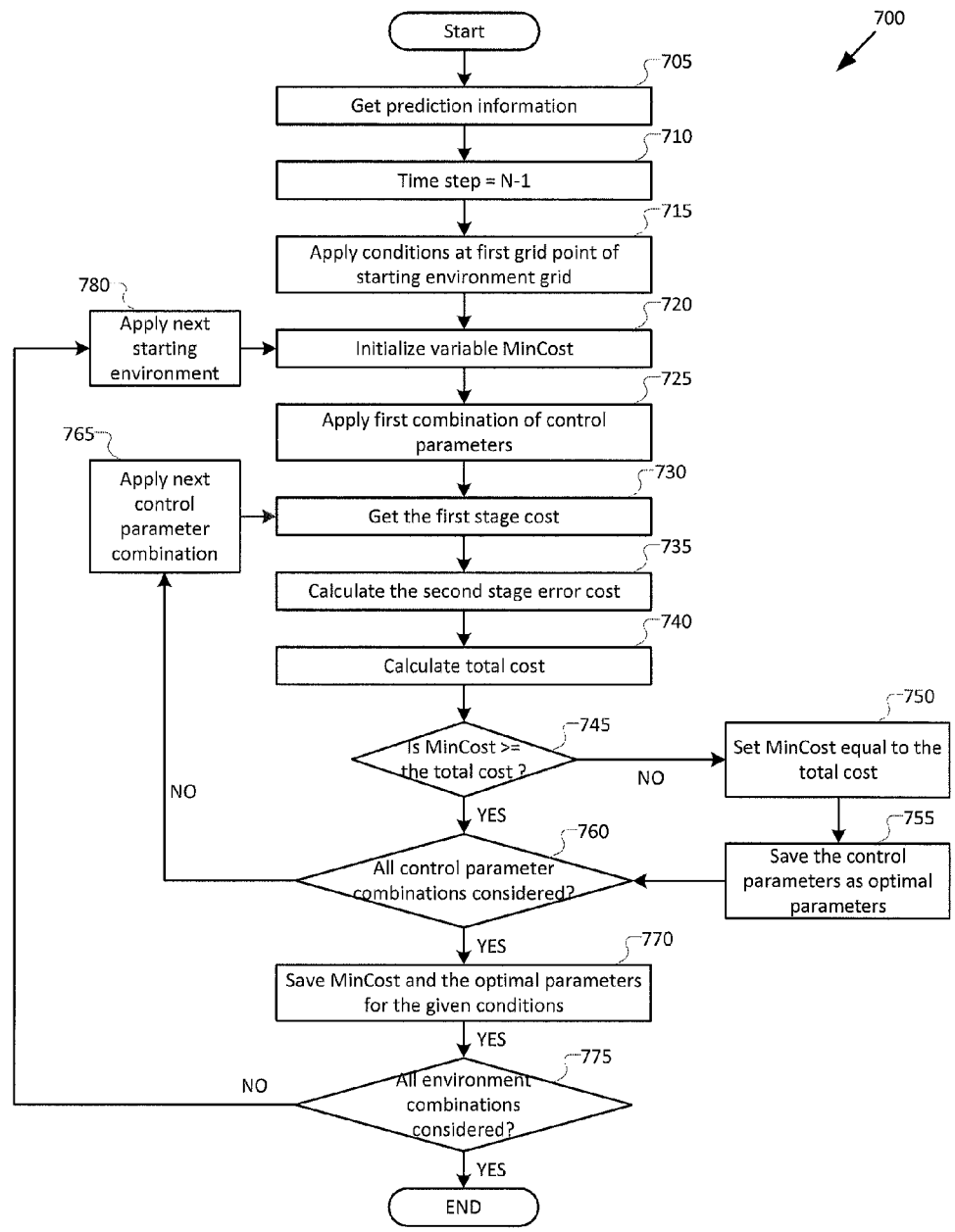
FIG. 7 illustrates an exemplary process for calculating optimal paths for a time step N−1 for a predicted time horizon N.
Figure 8:
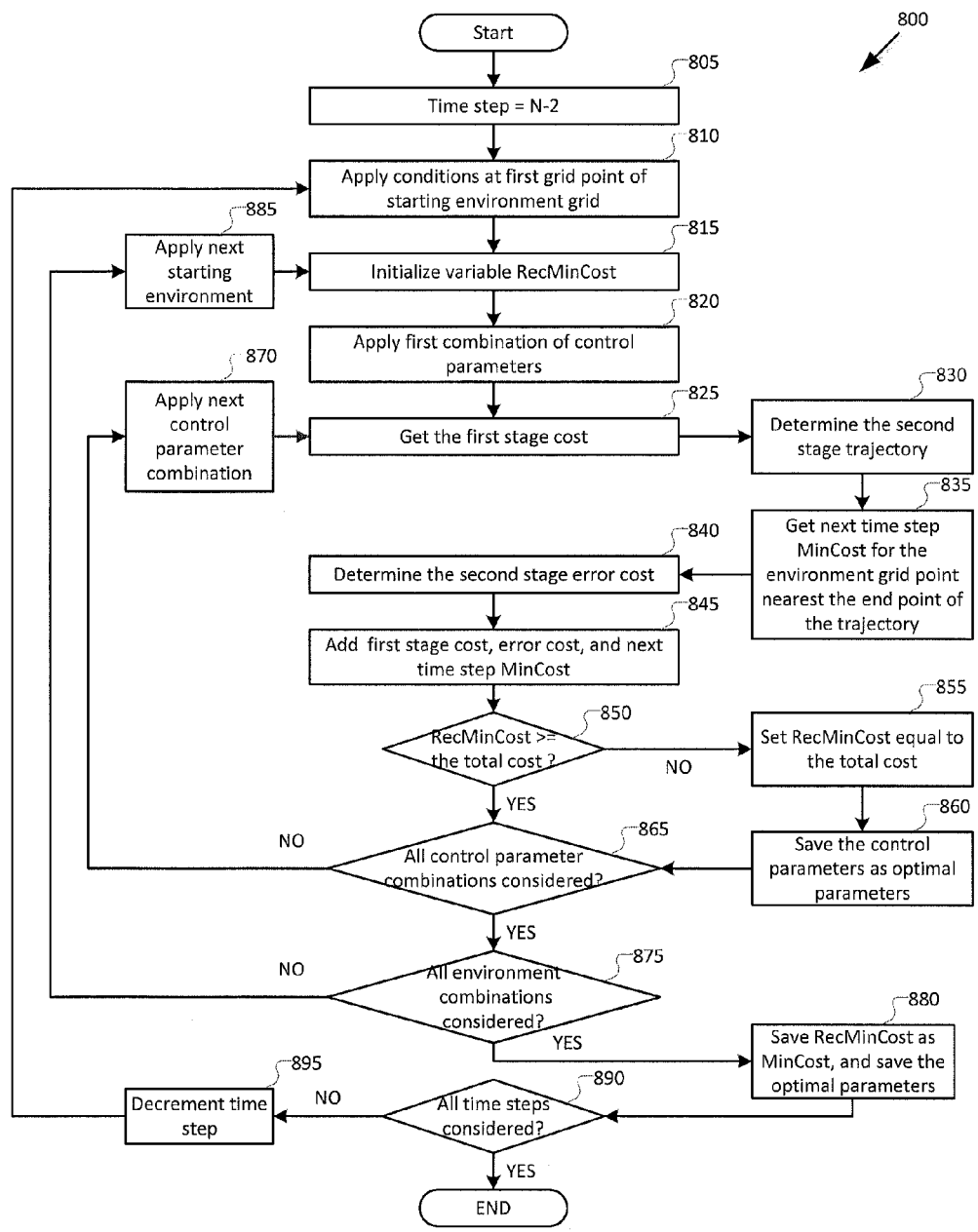
FIG. 8 illustrates an exemplary process for calculating optimal paths for time steps prior to time step N−1 for a predicted time horizon N.

Described above is the calculation of control parameters to apply based on current environment conditions and predicted environment conditions. FIGS. 6-8 illustrate exemplary processes for determining control parameters to apply at the current time step to achieve optimized performance for predicted time horizon N. Each time the prediction changes, new control parameters may be determined.

FIG. 6 illustrates a process 600 for calculating expected system response related to structural influences. Process 600 may be performed during development in the first stage. Process 600 begins at block 605.

At block 605, the first combination of environment conditions is applied to the model. At block 610, the first combination of control parameters is applied to the model.

At block 615, the expected system response related to structural influences and the associated expected cost of the system response is calculated using the model with starting conditions as applied at block 605 and control parameters as applied at block 610.

At block 620, the trajectory of the expected system response is determined. At block 625, information regarding the trajectory and the cost of the system response is stored, for example in a memory.

At decision point 630, if there are more control parameter combinations to consider for the starting conditions applied at block 605, process 600 continues at block 635 to apply the next combination of control parameters to the model, keeping the environment conditions as applied at block 605. Process 600 then continues at block 615 to determine expected system response for the environment conditions and control parameters. If at decision point 630 there are no more control parameter combinations to consider for the starting conditions applied at block 605, process 600 continues at decision point 640.

At decision point 640, if there are more environment condition combinations to consider, process 600 continues at block 645. At block 645, the next combination of environment conditions are applied to the model, and process 600 continues at block 610, calculating system response for each combination of control parameters. If at decision point 640 there are no more environment conditions to consider, process 600 ends.

After process 600 is completed, trajectory information is stored for each combination of environment conditions and control parameters considered. In some implementations of process 600, all possible combinations of environment conditions and control parameters are considered. In other implementations of process 600, only a subset of all possible combinations of environment conditions and control parameters is considered.

FIG. 7 illustrates a process 700 for calculating optimal paths for a time step N−1 for a predicted time horizon N. An optimal path at time step N−1 is calculated for each combination of environment conditions considered. Calculations are performed during the second stage, during system 100 operation. Process 700 begins at block 705.

At block 705, prediction information is accessed, for example, is read from data store 140 or received from prediction mechanism 130.

At block 710, the time step is set to N−1.

At block 715, the first combination of environment conditions is applied. For example, the first set of environment conditions is applied to a model, or the first set of environment conditions is used as one parameter for accessing a table or database or other storage.

At block 720, the variable MinCost is initialized to some large value. MinCost represents the lowest total cost of the system response cost plus the error cost. As the total cost related to each system response trajectory is calculated, it is compared to MinCost and if it is lower than MinCost it is saved as MinCost, as described below.

At block 725, the first combination of control parameters is applied. For example, the first combination of control parameters is applied to a model, or the first combination of control parameters is used another parameter for accessing a table or database or other storage.

At block 730, the system response cost calculated in the first stage for the combination of environment conditions and control parameters is accessed, for example, is read from data store 140.

At block 735, the second stage error cost is calculated from the difference of the predicted environment conditions at time step N and the expected environment conditions at time step N from the system response trajectory.

At block 740, total cost is calculated for the system response trajectory by adding at least the second stage error cost and the first stage system response cost.

At decision point 745, if the total cost is less than the value of MinCost, process 700 continues at 750.

At block 750, the total cost calculated at block 740 is saved as MinCost.

At block 755, information regarding the system response trajectory is saved, and the control parameters for the system response trajectory are identified as the optimal parameters. Process 700 continues at decision point 760. If at decision point 745, the total cost was not less than the value of MinCost, process 700 continues at decision point 760.

At decision point 760, if there are more control parameter combinations to consider for the starting conditions applied at block 715, process 700 continues at block 765 to apply the next combination of control parameters to the model, keeping the environment conditions as applied at block 715. Process 700 continues at block 730 to determine expected system response for the environment conditions and control parameters. If at decision point 760 there are no more control parameter combinations to consider for the starting conditions applied at block 715, process 700 continues at block 770.

At block 770, when all combinations of control parameters have been considered for the environment conditions applied at block 715, MinCost is saved for the environment conditions for time step N−1. Information regarding the trajectory associated with MinCost is also saved, including the control parameters applied.

At decision point 775, if there are more environment condition combinations to consider, process 700 continues at block 780. At block 780, the next combination of environment conditions are applied to the model, and process 700 continues at block 720, calculating system response for each combination of control parameters. If at decision point 775 there are no more environment conditions to consider, process 700 ends.

After process 700 is completed, at least MinCost and optimal control parameters are stored for each combination of environment conditions considered. In some implementations of process 700, all possible combinations of environment conditions are considered. In other implementations of process 700, only a subset of all possible combinations of environment conditions is considered.

As mentioned above, in some implementations there is a terminal cost associated with some or all gridpoints at time step N such that total cost, for example as calculated in block 740 above, includes a terminal cost component. In such implementations, calculation for time step N may be similar to calculation for earlier time steps, as will be illustrated in the following discussion of FIG. 8.

FIG. 8 illustrates a process 800 for calculating optimal paths for time steps prior to time step N−1 for a predicted time horizon N, using information from time step N−1, for example as calculated in process 700. For implementations in which there is a terminal cost associated with at least one gridpoint at time step N, FIG. 8 may also apply to the calculations at time step N−1, in which case additional calculations for time step N−1 may not be necessary. An optimal path is calculated for each combination of environment conditions considered. Calculations are performed during the second stage, during system 100 operation. Process 800 begins at block 805.

At block 805, the time step is set to N−2.

At block 810, the first combination of environment conditions is applied. For example, the first set of environment conditions is applied to a model, or the first set of environment conditions is used as one parameter for accessing a table or database or other storage.

At block 815, the variable RecMinCost is initialized to some large value. RecMinCost represents a recursive minimum cost, the lowest total cost of the system response cost plus the error cost plus the MinCost from the next time step. For example, at time step N−2, MinCost may be as calculated in process 700 for time step N−1. As the total cost related to each system response trajectory is calculated, it is compared to RecMinCost and if it is lower than RecMinCost it is saved as RecMinCost, as described below.

At block 820, the first combination of control parameters is applied. For example, the first combination of control parameters is applied to a model, or the first combination of control parameters is used another parameter for accessing a table or database or other storage.

At block 825, the system response cost calculated in the first stage for the combination of environment conditions and control parameters is accessed, for example, is read from data store 140.

At block 830, the trajectory for the applied combination of environment conditions and control parameters is determined. For example, the trajectory may be read or calculated from mapping information 145 in data store 140.

At block 835, the trajectory end point at the next time step is determined and the MinCost for the nearest environment gridpoint is accessed. For example, when calculating at time step N−2, the trajectory end point at time step N−1 is determined, the nearest discrete combination of environment conditions (e.g., gridpoints) at time step N−1 is determined, and the MinCost for the nearest discrete combination of environment conditions at time step N−1 is accessed. The MinCost accessed was previously calculated for time step N−1, for example in process 700. For implementations in which there is a terminal cost associated with at least one gridpoint at time step N and process 800 is used for calculations at time step N−1, MinCost is replaced by terminal cost at time step N−1.

In some implementations, instead of selecting the nearest discrete combination of environment conditions to the trajectory end point, a heuristic interpolates between values of MinCost of discrete combination of environment conditions (e.g., gridpoints) to the trajectory end point.

At block 840, the second stage error cost is calculated from the difference of the predicted environment conditions at the next step and the expected environment conditions at the next time step. For example, when calculating at time step N−2, the error cost is the difference of the predicted environment conditions for time step N−1 and the trajectory end point at time step N−1.

At block 845, total cost is calculated for the system response trajectory by adding at least the second stage error cost, the first stage system response cost, and the MinCost accessed at block 835.

At decision point 850, if the total cost is less than the value of RecMinCost, process 800 continues at 855.

At block 855, the total cost calculated at block 845 is saved as RecMinCost.

At block 860, information regarding the system response trajectory is saved, and the control parameters for the system response trajectory are identified as the optimal parameters. Process 800 continues at decision point 865. If at decision point 850, the total cost was not less than the value of RecMinCost, process 800 continues at decision point 865.

At decision point 865, if there are more control parameter combinations to consider for the starting conditions applied at block 810, process 800 continues at block 870 to apply the next combination of control parameters to the model, keeping the environment conditions as applied at block 810. Process 800 then continues at block 825. If at decision point 865 there are no more control parameter combinations to consider for the starting conditions applied at block 810, process 800 continues at block 875.

At block 875, when all combinations of control parameters have been considered for the environment conditions applied at block 810, RecMinCost is saved as MinCost for the environment conditions for the time step under consideration. Information regarding the trajectory associated with RecMinCost is also saved, including the control parameters applied.

At decision point 875, if there are more environment condition combinations to consider, process 800 continues at block 885. At block 885, the next combination of environment conditions are applied to the model, and process 800 continues at block 815, calculating system response for each combination of control parameters. If at decision point 875 there are no more environment conditions to consider, process 800 continues at decision point 890.

At decision point 890, if all time steps from time step N−1 to the current time have not been considered, process 800 continues at block 895 to decrement the time step, and then continues at block 810. If at decision point 890 all time steps from time step N−1 to the current time have been considered, process 800 ends.

After process 800 is completed, for each time step N−1 to the current time, at least MinCost and optimal control parameters are stored for each combination of environment conditions considered. In some implementations of process 800, all possible combinations of environment conditions are considered. In other implementations of process 800, only a subset of all possible combinations of environment conditions is considered.

At the current time, the optimal control parameters determined for the current time are applied. The optimal control parameters for the current time are determined based on the predictions up to time horizon N. If the predictions do not change and the actual environment conditions follow the predictions, the information calculated for the time steps to N−1 may remain valid. As the predictions change, or if the actual environment conditions do not follow the predictions, some of the information calculated for time steps within the prediction horizon may become invalid and process 800 may be performed again for one or more time steps.

CONCLUSION

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claimed invention.

Accordingly, it is to be understood that the above description is intended to be illustrative and not restrictive. Many embodiments and applications other than the examples provided would be apparent upon reading the above description. The scope of the invention should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the invention is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

What is claimed is:

1. A method, comprising:
    receiving from a prediction mechanism predicted environment conditions for a time step N within a prediction horizon;
    accessing from a data store information regarding a first set of expected system responses generated by a physical system model provided with a first combination of starting environment conditions, each expected system response generated by the model being a response to applying a different combination of control parameter states to the model;
    for time step N−1, for each expected system response in the first set of expected system responses,
        accessing a response cost and a response trajectory from the information regarding the first set of expected system responses;
        determining an endpoint for the response trajectory at time step N, the response trajectory starting from time step N−1;
        determining an error cost for the response trajectory related to the difference between the environment conditions at the endpoint of the response trajectory and the predicted environment conditions for time step N; and calculating a total cost for the expected system response by adding the response cost and the error cost; and designating the expected system response of the first set of expected system responses with minimum total cost as the first optimal response for time step N−1, the first optimal response related to the first combination of starting environment conditions and the predicted time step N environment conditions.

2. The method of claim 1, further comprising:

storing in the data store information regarding the first optimal response for time step N−1, including information regarding the total cost of the first optimal response for time step N−1, the first combination of starting environment conditions, and the combination of control parameter states that caused the model to generate the system response designated as the first optimal response for time step N−1.

3. The method of claim 2, further comprising:

accessing from the data store information regarding a second set of expected system responses generated by the system model, the model being provided with a second combination of starting environment conditions, and each expected system response generated by the model being a response to a different combination of control parameter states being applied to the model;

for time step N−1, for each expected system response in the second set of expected system responses, accessing a response cost and a response trajectory from the information regarding the first set of expected system responses;

determining an endpoint for the response trajectory at time step N, the response trajectory starting from time step N−1;

determining an error cost for the response trajectory related to the difference between the environment conditions at the endpoint of the response trajectory and the predicted environment conditions for time step N; and calculating a total cost for the expected system response by adding the response cost and the error cost;

designating the expected system response of the second set of expected system responses with minimum total cost as the second optimal response for time step N−1, the second optimal response related to the second combination of starting environment conditions and the predicted time step N environment conditions; and storing in the data store information regarding the second optimal response for time step N−1, including information regarding the total cost of the second optimal response for time step N−1, the second combination of starting environment conditions, and the combination of control parameter states that caused the model to generate the system response designated as the second optimal response for time step N−1.

4. The method of claim 3, further comprising:

determining a set of M optimal responses for time step N−1, each optimal response relating to one combination of starting environment conditions, the set of M optimal responses relating to the predicted environment conditions at time step N, the set of M optimal responses including the first optimal response for time step N−1 and the second optimal response for time step N−1.

5. The method of claim 4, further comprising:

receiving from a prediction mechanism predicted environment conditions for a time step N−1 within the prediction horizon;

for each expected system response in the first set of expected system responses, accessing the response cost and the response trajectory;

determining an endpoint for the response trajectory at time step N−1, the response trajectory starting from time step N−2;

determining an error cost for the response trajectory related to the difference between the environment conditions at the endpoint of the response trajectory and the predicted environment conditions for time step N−1;

determining from the set of M optimal responses for time step N−1 the combination of starting environment conditions nearest to the response trajectory endpoint environment conditions;

accessing the total cost of the optimal response for time step N−1 related to the nearest combination of starting environment conditions; and calculating a total recursive cost for the expected system response by adding the response cost, the error cost, and the total cost of the optimal response for time step N−1 related to the nearest combination of starting environment conditions;

designating the expected system response of the first set of expected system responses with minimum total recursive cost as the first optimal response for time step N−2, the first optimal response related to the first combination of starting environment conditions and the predicted time step N environment conditions; and storing in the data store information regarding the first optimal response for time step N−2, including information regarding the total recursive cost of the first optimal response for time step N−2 and the combination of control parameter states and starting environment conditions that caused the model to generate the system response designated as the first optimal response for time step N−2.

6. The method of claim 5, further comprising:

determining a set of K optimal responses for time step N−2, each optimal response relating to one combination of starting environment conditions, the set of K optimal responses relating to the predicted environment conditions at time step N, the set of K optimal responses including the first optimal response for time step N−2.

7. The method of claim 6, further comprising:

determining a set of optimal responses for each time step N−3 to the current time step relating to predicted environment conditions of time steps to time step N; and applying to the system the combination of control parameters indicated by the optimal response for the current time step for the current environment conditions.

8. The method of claim 1, the system model being a model of the structure of a vehicle, at least a portion of the response cost being fuel consumed, the environment conditions including speed, and an expected system response trajectory being acceleration.

9. The method of claim 8, the vehicle being a hybrid vehicle with at least two power sources.

10. The method of claim 9, the at least two power sources including at least two from a group of power sources including internal combustion engine, electric motor, hydraulic motor, and fuel cell.

11. The method of claim 9, a control parameter being applied torque.

12. The method of claim 8, an endpoint for the response trajectory at time step N being an expected speed resulting from the acceleration from time step N−1, and at least a portion of the error cost being a difference between the expected speed resulting from the acceleration from time step N−1 and the predicted speed for time step N from the prediction mechanism.

13. A system, comprising:
a prediction mechanism predicting environment conditions for time steps up to a time step N within a time horizon;
a data store including information regarding a first set of expected system responses generated by a system model where each expected system response has a response trajectory, the model being provided with a first combination of starting environment conditions, and each expected system response generated by the model being a response to a different combination of control parameter states being applied to the model;
a computing device including at least one processor, the computer device determining the expected system response of the first set of expected system responses with a minimum total cost as the first optimal response for time step N−1 where the minimum total cost is based at least in part on the expected system response trajectories starting from time step N−1 and having an endpoint at time step N, the first optimal response related to the first combination of starting environment conditions and predicted environment conditions for time step N.

14. The system of claim 13, further comprising:
the computing device determining a set of M optimal responses for time step N−1, each optimal response relating to one combination of starting environment conditions, the set of M optimal responses relating to the predicted environment conditions at time step N, the set of M optimal responses including the first optimal response for time step N−1.

15. The system of claim 14, further comprising:
the computing device determining a set of optimal responses for each time step N−2 to the current time step relating to the predicted environment conditions to time step N and applying to the system the combination of control parameters indicated by the optimal response for the current time step for the current environment conditions.

16. The system of claim 13, the system model being a model of the structure of a vehicle, at least a portion of the response cost being fuel consumed, the environment conditions including speed, and the expected system response trajectory being acceleration.

17. The system of claim 16, the vehicle being a hybrid vehicle with at least two power sources.

18. The system of claim 17, the at least two power sources including at least two from a group of power sources including internal combustion engine, electric motor, hydraulic motor, and fuel cell.

19. The system of claim 17, a control parameter being applied torque.

20. The system of claim 16, the endpoint for the response trajectory at time step N being an expected speed resulting from the acceleration from time step N−1, and at least a portion of the error cost being a difference between the expected speed resulting from the acceleration from time step N−1 and the predicted speed for time step N from the prediction mechanism.

21. A method, comprising:
receiving from a prediction mechanism predicted environment conditions for time steps up to a time step N within a prediction horizon;
accessing from a data store information regarding expected system responses generated by a system model, each expected system response having a response trajectory, and each expected system response being a response to a different combination of control parameters and starting environment conditions being applied to the model;
designating an optimal response for each combination of starting environment conditions for each time step within the prediction horizon from time step N−1 to the current time step, each optimal response based in part on the expected system response and the predicted environment conditions, each optimal response in a time step based at least in part on an optimal response determined for a later time step and the expected system response trajectories starting from the time step to the later time step;
identifying the combination of control parameters causing the model to generate the system response designated as the optimal response at the current time step, the starting environment conditions of the model similar to current environment conditions; and
applying the identified control parameters to the system.

22. The method of claim 21, the system model being a model of the structure of a vehicle, and an environment condition being speed.

23. The method of claim 22, the vehicle being a hybrid vehicle with an internal combustion engine and an electric motor, and a control parameter being applied torque.

24. The method of claim 22, an environment condition being battery state of charge.

* * * * *